United States Patent [19]
Dapper et al.

[11] Patent Number: 5,859,876
[45] Date of Patent: Jan. 12, 1999

[54] METHOD AND APPARATUS FOR IMPROVING AM COMPATIBLE DIGITAL BROADCAST ANALOG FIDELITY

[76] Inventors: Mark J. Dapper, 6558 Baywood, Cinncinnati, Ohio 45224; Michael J. Geile, 316 Miami Valley Dr., Loveland, Ohio 45140; Barry Walter Carlin, 1001 Ligorio Ave., Cincinnati, Ohio 45218

[21] Appl. No.: 671,252

[22] Filed: Jun. 27, 1996

Related U.S. Application Data

[63] Continuation-in-part of Ser. No. 368,061, Jan. 3, 1995, abandoned.

[51] Int. Cl.$^6$ .......................... H04L 27/04; H04L 23/02; H03C 1/00; H04N 7/24
[52] U.S. Cl. .......................... 375/295; 375/298; 375/261; 375/300; 370/206; 370/207; 332/149; 332/150; 348/471; 348/472
[58] Field of Search .................................... 375/295, 296, 375/298, 260, 268, 261, 285, 300–301, 320, 216; 455/108; 370/206, 207; 332/149, 150, 103; 348/471, 472, 487, 473, 437, 608, 609

[56] References Cited

U.S. PATENT DOCUMENTS

| | | | |
|---|---|---|---|
| 4,525,846 | 7/1985 | Bremer et al. | 375/261 |
| 4,534,026 | 8/1985 | Martinez et al. | 370/207 |
| 4,584,541 | 4/1986 | Nossen | 332/145 |
| 4,761,798 | 8/1988 | Griswold, Jr. et al. | 375/295 |
| 5,598,436 | 1/1997 | Brajal et al. | 375/297 |

*Primary Examiner*—Chi H. Pham
*Assistant Examiner*—Khai Tran

[57] ABSTRACT

A digital signal transmission system is provided which minimizes the AM signal envelope distortion caused by multiple digitally modulated carriers in the same band as the AM signal. The system transmits an amplitude modulated signal. Digital carriers for the digital signal are placed both above and below the frequency of the analog AM carrier. Certain digital carriers that are above the frequency of the analog AM carrier have an associated digital carrier that is at an equal frequency offset below the analog AM carrier. The data and modulation placed on the upper digital carrier and its counterpart are such that the signal resulting from their addition has no component that is in-phase with the analog AM carrier. The signal envelope is predistorted to counteract the distortion added by the digital carriers.

12 Claims, 3 Drawing Sheets

METHOD AND APPARATUS FOR IMPROVING AM COMPATIBLE DIGITAL BROADCAST ANALOG FIDELITY

This application is a continuation-in-part of U.S. patent application Ser. No. 08/368,061, filed Jan. 3, 1995 which has been abandoned.

BACKGROUND OF THE INVENTION

1. Field of the Invention

This invention relates to radio broadcasting and, more particularly, to methods of and apparatus for improving AM compatible digital broadcast analog fidelity.

2. Description of Related Art

There has been increasing interest in the possibility of broadcasting digitally encoded audio signals to provide improved audio fidelity. Several approaches have been suggested. One such approach, set forth in co-pending patent application Ser. No. 08/206,368, filed Mar. 7, 1994, assigned to the assignee hereof, now U.S. Pat. No. 5,588,022, teaches a method for simultaneously broadcasting analog and digital signals in a standard AM broadcasting channel. An amplitude modulated radio frequency signal having a first frequency spectrum is broadcast. The amplitude modulated radio frequency signal includes a first carrier modulated by an analog program signal. Simultaneously, a plurality of digitally modulated carrier signals are broadcast within a bandwidth which encompasses the first frequency spectrum. Each of the digitally modulated carrier signals is modulated by a portion of a digital program signal. A first group of the digitally modulated carrier signals lies within the first frequency spectrum and is modulated in quadrature with the first carrier signal. Second and third groups of the digitally modulated carrier signals lie outside of the first frequency spectrum and are modulated both in-phase and in-quadrature with the first carrier signal. Both transmitters and receivers are provided in accordance with that method.

Monophonic detectors for consumer AM radios respond only to the envelope and not the phase of the received signal. For this reason, when digital transmission is added to an amplitude modulated system, envelope distortion is minimized if the digital information is placed in quadrature with the amplitude modulated carrier. The waveform in the AM compatible digital audio broadcasting system described in U.S. Pat No. 5,558,022 hereby incorporated herein by reference, combines analog amplitude modulation with multiple digitally modulated carriers in the same spectrum as the analog AM signal. Because of the use of the multiple digitally modulated carriers, there is a need for a means to reduce the envelope distortion caused by this hybrid signal.

SUMMARY OF THE INVENTION

The digital signal transmission system of the present invention successfully minimizes analog AM signal envelope distortion caused by multiple digitally modulated carriers in the same channel as the analog AM signal. The present transmission system includes means for transmitting an amplitude modulated signal. Digital carriers for the digital signal are placed both above and below the frequency of the analog AM carrier. Certain digital carriers that are above the frequency of the analog AM carrier have an associated digital carrier that is at an equal frequency offset below the analog AM carrier. The data and modulation placed on the upper digital carrier and its counterpart are such that the signal resulting from their addition has no component that is in-phase with the analog AM carrier. Digital carrier pairs arranged in this way are said to be complementary. This configuration delivers dramatic fidelity improvements to analog AM reception of digital broadcast signals. An additional means of reducing envelope distortion is to predistort the signal envelope. The signal envelope is predistorted to counteract the distortion added by the digital carriers.

BRIEF DESCRIPTION OF THE DRAWINGS

The invention will be more readily apparent to those skilled in the art by reference to the accompanying drawings.

DETAILED DESCRIPTION OF THE PREFERRED EMBODIMENTS

A composite signal which combines analog amplitude modulation with multiple digitally modulated carriers in the same band as the analog AM signal is discussed in U.S. Pat No. 5,558,022 hereby incorporated herein by reference. Such a waveform is part of a method for broadcasting digital audio information in the medium wave band co-channel with existing analog AM signals. When digital transmission is added to an amplitude modulated system, envelope distortion is minimized if the digital information is placed in quadrature with the amplitude modulated carrier. When digital signals are in-phase with the analog carrier, the post-detection signal-to-noise ratio varies directly with the predetection signal-to-noise ratio. When the digital signals are placed in quadrature, however, the post-detection signal-to-noise ratio varies as the square of the predetection signal-to-noise ratio. This effect can be used to advantage when the digital information and the analog signal both occupy the same channel. However, it can be advantageous to distribute the digital information across multiple frequency division multiplexed carriers. Such is the case for the medium wave band digital audio broadcasting method which is the subject of U.S. Pat No. 5,558,022. In the case of a medium wave digital broadcasting method, the use of multiple carriers permits both the amplitude and the complexity of the symbol set associated with each carrier to be tailored in order to achieve optimum performance in the presence of highly colored interference from co-channel and adjacent channel interference sources.

Figure 1:
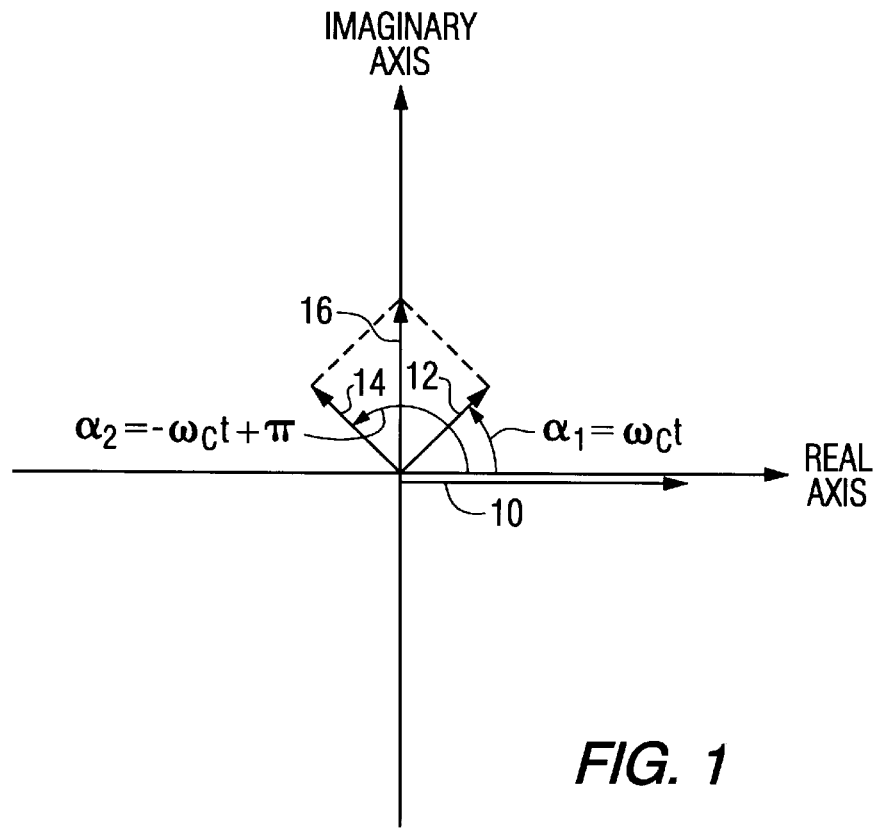
FIG. 1 is a phase-plane plot of the in-phase cancellation technique of the present invention applied to one pair of complementary digital broadcast carriers.

The technique of the present invention is shown for a single complementary carrier pair in the phase-plane plot of FIG. 1, where it is assumed that the AM carrier 10 is provided along the positive real axis. A single digital carrier 12, offset from the AM carrier 10, produces a rotating vector $(\alpha_1 = \omega_c t)$ with respect to the AM carrier 10, which creates envelope distortion primarily through its projection onto the AM carrier 10. Its complementary carrier 14 is placed in both frequency and phase in such a manner as to ensure that the sum of the digital carriers 12 and 14, denoted by digital carrier 16, has no projection along the real axis, which is assumed to be the axis of the AM carrier. This reduces crosstalk from the digital waveform onto the analog AM since these signals are now in quadrature and the analog AM is collinear with its associated AM carrier phaser 10. Carrier 14 produces a rotating vector ($\alpha_2 = -\omega_c t + \pi$) which rotates in the opposite direction as the vector $\alpha$ produced by digital carrier 12. Consequently, digital carriers 12 and 14 are equidistant in frequency from the AM carrier, and, in addition, must have identical data and modulation applied in order to achieve phase quadrature with the AM carrier. Furthermore, in the general case of quadrature amplitude modulation (QAM), the in-phase component (I rail) of digital carrier 14 needs to be inverted with respect to that of digital carrier 12. This achieves the phase shift of $\pi$ noted for digital carrier 14 in FIG. 1.

The technique used to construct a single complementary carrier pair can be repeated to create multiple pairs of complementary carriers. The principle of superposition guarantees that the resultant digital waveform is in quadrature with the analog AM, thereby maximizing its fidelity.

Any distortion remaining in the transmission system can be further reduced or eliminated by adding a compensation vector along the real axis. The length of this vector is adjusted so that the amplitude of the composite signal is equal to that of the analog AM signal alone. This process is illustrated in the phase-plane plot of FIG. 2 for a single digital complementary carrier pair. This same predistortion technique is also valid for multiple pairs of digital complementary carriers.

Figure 2:
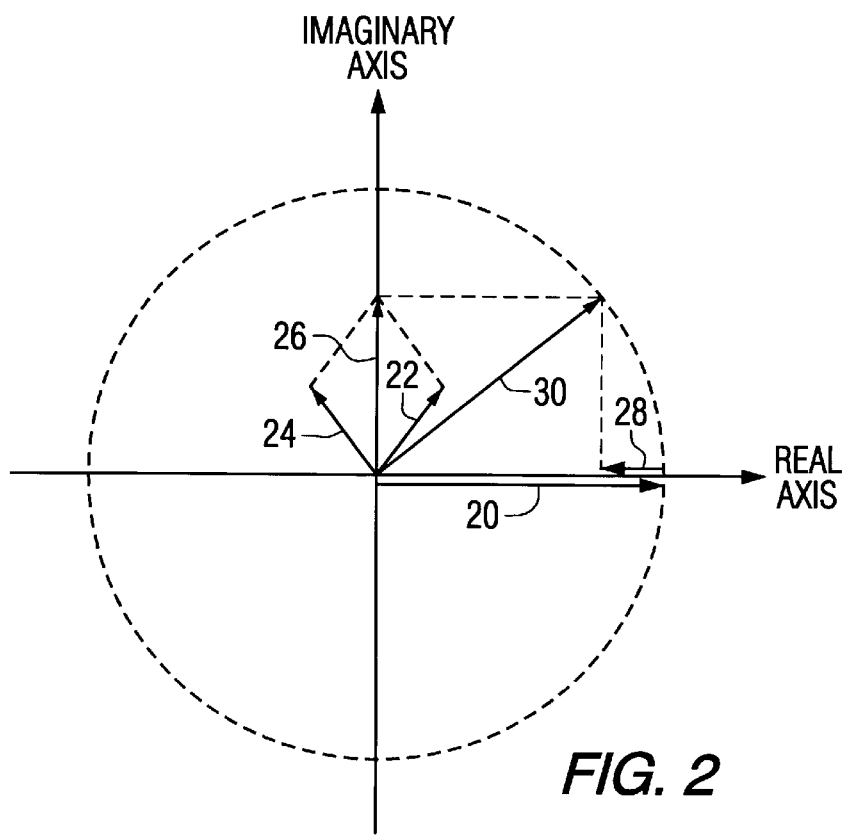
FIG. 2 is a phase-plane plot of a predistortion technique to further reduce signal envelope distortion.

In FIG. 2, the AM carrier 20 is placed along the positive real axis. A complementary digital carrier pair, 22 and 24, has a resultant 26 that is normal to the AM carrier 20, thereby eliminating any projection of this complementary pair onto the analog modulation. Predistortion 28 is added to AM carrier 20 to generate a cumulative transmitted vector 30 that has the same amplitude as the AM carrier 20. This predistortion technique therefore cancels signal envelope distortion in the composite analog and digital waveform.

Figure 3:
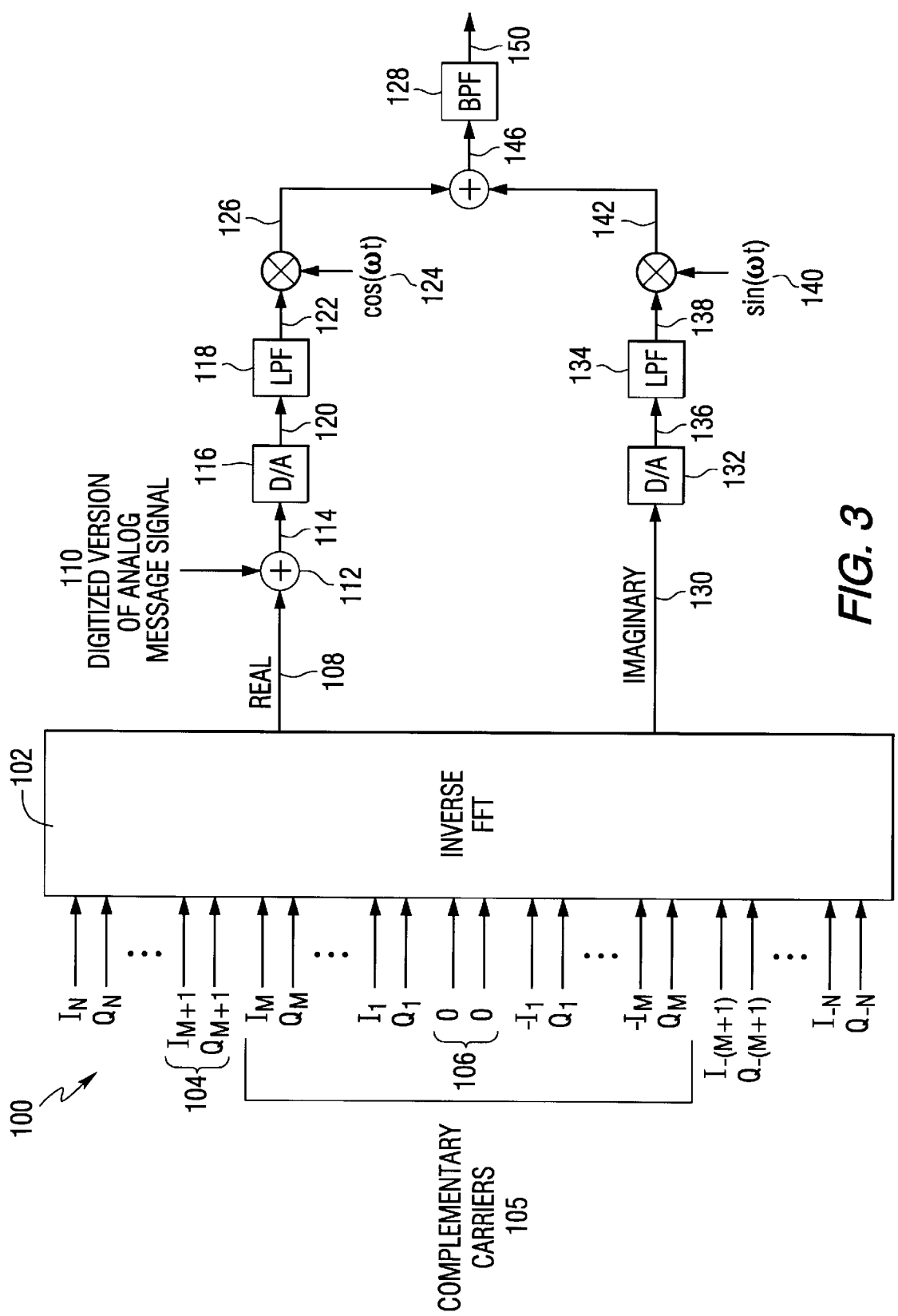
FIG. 3 is a block diagram showing the presently preferred circuitry for carrying out the present invention.
Figure 4:
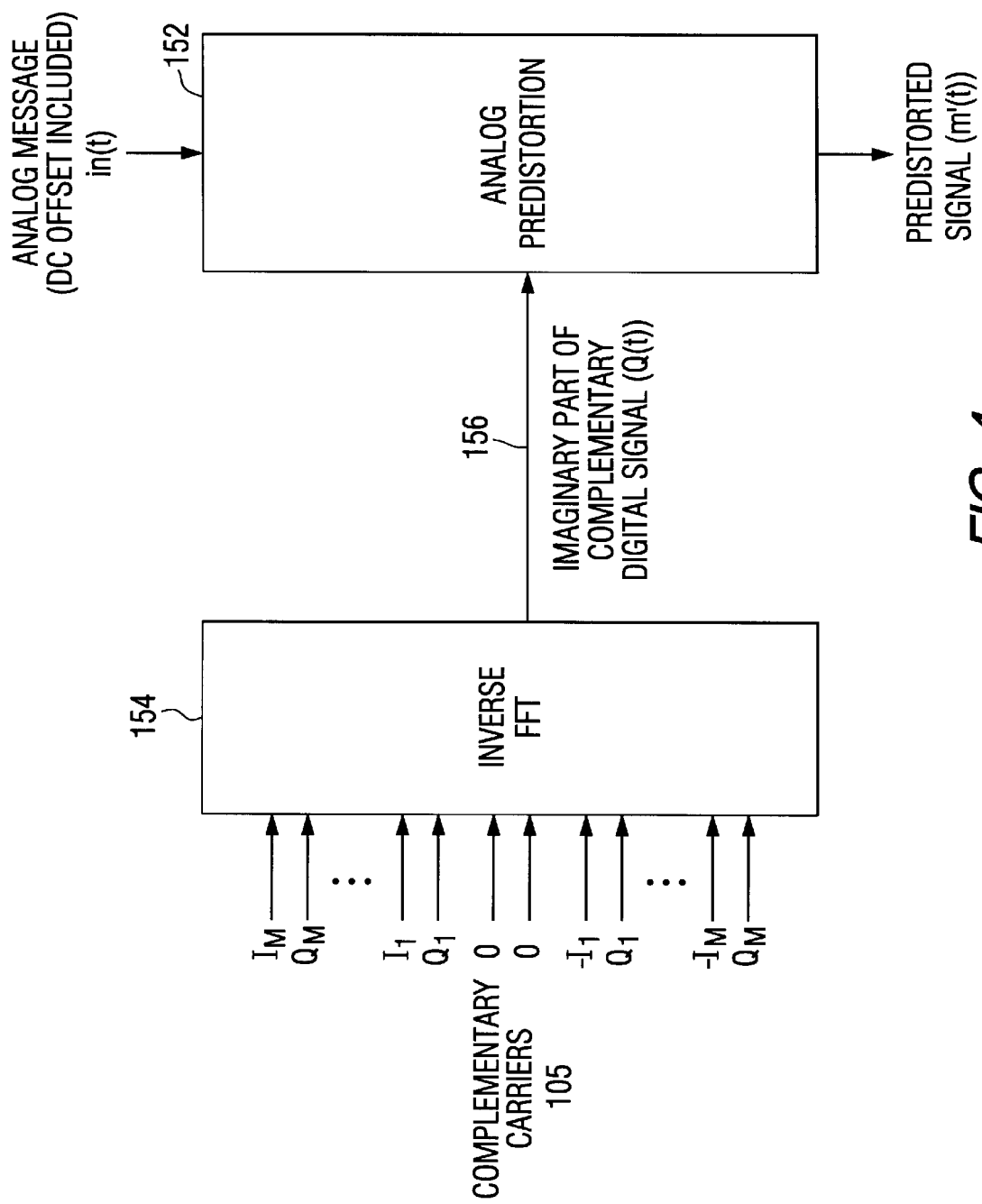
FIG. 4 is a block diagram showing a presently preferred embodiment of a predistortion processor used in accordance with the present invention.

FIGS. 3 and 4 illustrate the circuitry involved in a presently preferred embodiment of the present invention. As shown in FIG. 3, information 100 to be sent is shown as the input to inverse Fast Fourier Transform (FFT) 102. The I's and Q's in input 100 represent the real and imaginary components, respectively, of the digital carriers. Each I and Q pair 104 is associated with a particular digital carrier. The carriers N through M+1 and –(M+1) through –N are normal, non-complementary carriers. The information on each of these carriers is independent of the other carriers. The remaining carriers 105 are denoted as complementary. Carrier 106, at the middle of the channel, has zero real and imaginary components. Carrier 106, which has no energy, is at DC.

For each pair of carriers that are equidistant from carrier 106 and still within the complementary section, the in-phase component (I) of the pair of carriers is the negative of the corresponding carrier while the quadrature components (Q's) of the carriers are equal. This use of complementary carriers reduces the information that can be sent on these carriers by half, but results in the phasor representation shown in FIG. 1, thereby minimizing the interference to the analog signal.

As shown in FIG. 3, the real part output 108 from the inverse FFT is added to the digitized version of the analog message signal 110 at adder 112. The output 114 of adder 112 is applied to a digital-to-analog converter 116. A lowpass reconstruction filter 118 processes this output 120 of converter 116. Thereafter, signal 122 from filter 118 is upconverted by the in-phase version 124 of the carrier signal, denoted on FIG. 3 as $\cos(\omega t)$.

Similarly, the imaginary part output 130 from the inverse FFT is applied to a digital-to-analog converter 132. A lowpass reconstruction filter 134 processes this output 136 of converter 132. Thereafter, signal 138 from filter 134 is upconverted by the quadrature version 140 of the carrier signal, denoted on FIG. 3 as $\sin(\omega t)$. Upconverted signal 142 is then added to signal 126. The resulting summed signal 146 is then input to bandpass filter 128. The bandpass filter output is the transmitted signal 150.

FIG. 4 illustrates an embodiment of the predistortion technique preferably used in the present invention. The complementary carrier information 105 is input to an inverse FFT 154 producing the imaginary part of the complementary digital signal 156, Q(t). Due to the antihermetian symmetry of input 105, the output of FFT 154 is ideally purely imaginary. The analog predistortion processor also has as input the analog message m(t), which includes the DC offset normally associated with AM processing. Predistortion processor 152 uses inputs m(t) and Q(t) to produce an output m'(t), such that:

$$m'(t) = \text{sqrt}[(m(t))^2 - (Q(t))^2],$$

wherein sqrt denotes the square root operation with the positive root being chosen.

When used in an implementation similar to that shown in FIG. 3, the output m'(t) of predistortion processor 152 would be used as signal 110. Although the notation implies that this operation is performed using analog processing, the operation can also be performed using digital processing.

In the foregoing specification certain preferred practices and embodiments of this invention have been set out. However, it will be understood that the invention may be otherwise embodied within the scope of the following claims.

We claim:

1. A combined amplitude modulated and digital signal transmission system;
   a. means for transmitting an amplitude modulated signal, said amplitude modulated signal consisting of an RF carrier amplitude modulated that is amplitude modulated by a baseband signal; and
   b. means for producing a complementary pair of digitally modulated carriers and transmitting said complementary pair of digitally modulated carriers in quadrature to said amplitude modulated signal, said complementary pair of digitally modulated carriers being separated from said amplitude modulated carrier by an equal and opposite frequency offset and having amplitudes and phases so that the addition of said complementary pair of digitally modulated carriers results in a signal that is in phase quadrature to said amplitude modulated signal.

2. The system of claim 1 further comprising means for selectively placing data on each of said complementary pair of digitally modulated carriers so that the addition of said pair results in a signal that is in phase quadrature to said amplitude modulated signal.

3. The system of claim 1 further comprising means for adding a compensation vector to said baseband signal such that the distortion to the envelope of the signal resulting from the addition of the amplitude modulated signal and the complementary pair of digitally modulated carriers is minimized.

4. A combined amplitude modulated and digital signal transmission system comprising:

a. means for transmitting an amplitude modulated signal, said amplitude modulated signal consisting of an RF amplitude modulated carrier that is amplitude modulated by a baseband signal; and b. means for producing multiple pairs of complementary digitally modulated carriers and transmitting said multiple pairs of complementary digitally modulated carriers in quadrature to said amplitude modulated signal, said multiple pairs of complementary digitally modulated carriers being separated from said amplitude modulated carrier by an equal and opposite frequency offset and having amplitudes and phases so that the addition of said multiple pairs of digitally modulated carriers results in a signal that is in phase quadrature to said amplitude modulated signal.

5. The system of claim 4 further comprising means for selectively placing data on each of said multiple pairs of complementary digitally modulated carriers so that the addition of all of said multiple pairs of carriers results in a signal that is in phase quadrature to said amplitude modulated signal.

6. The system of claim 4 further comprising means for adding a compensation vector to said baseband signal such that the distortion to the envelope of the signal resulting from the addition of the amplitude modulated signal and the multiple pairs of complementary digitally modulated carriers is minimized.

7. A method for transmitting in a combined amplitude modulated and digital signal comprising the steps of:

a. transmitting an amplitude modulated signal, said amplitude modulated signal consisting of an RF amplitude modulated carrier that is amplitude modulated by a baseband signal; and b. producing a complementary pair of digitally modulated carriers and transmitting said complementary pair of digitally modulated carriers in quadrature to said amplitude modulated signal, said complementary pair of digitally modulated carriers being separated from said amplitude modulated carrier by an equal and opposite frequency offset and having phases and amplitudes so that the addition of said complementary pair of digitally modulated carriers is in phase quadrature to said amplitude modulated signal.

8. The method of claim 7 further comprising the step of selectively placing data on each of said complementary pair of digitally modulated carriers so that the addition of said pair results in a signal that is in phase quadrature to said amplitude modulated signal.

9. The method of claim 7 further comprising the step of adding a compensation vector to said baseband signal such that the distortion to the envelope of the signal resulting from the addition of the amplitude modulated signal and the complementary pair of digitally modulated carriers is minimized.

10. A method for transmitting an amplitude modulated signal and a digital signal comprising the steps of:

a. transmitting an amplitude modulated signal, said amplitude modulated signal consisting of an RF amplitude modulated carrier that is amplitude modulated by a baseband signal; and b. producing multiple pairs of complementary digitally modulated carriers and transmitting said multiple pairs of complementary digitally modulated carriers in quadrature to said amplitude modulated signal, said multiple pairs of complementary digitally modulated carriers being separated from said amplitude modulated carrier by an equal and opposite frequency offset and having phases and amplitudes so that the addition of said multiple pairs of complementary digitally modulated carriers is in phase quadrature to said amplitude modulated signal.

11. The method of claim 10 further comprising the step of selectively placing data on each of said multiple pairs of complementary digitally modulated carriers so that the addition of all of said multiple pairs of carriers is in phase quadrature to said amplitude modulated signal.

12. The method of claim 10 further comprising the step of adding a compensation vector to said baseband signal such that the distortion to the envelope of the signal resulting from the addition of the amplitude modulated signal and the multiply pairs of complementary digitally modulated carriers is minimized.

* * * * *